United States Patent [19]

Taguchi

[11] Patent Number: 5,432,361
[45] Date of Patent: Jul. 11, 1995

[54] LOW NOISE AVALANCHE PHOTODIODE HAVING AN AVALANCHE MULTIPLICATION LAYER OF INALAS/INGAALAS

[75] Inventor: Kenko Taguchi, Tokyo, Japan

[73] Assignee: NEC Corporation, Tokyo, Japan

[21] Appl. No.: 148,429

[22] Filed: Nov. 8, 1993

Related U.S. Application Data

[63] Continuation of Ser. No. 761,078, Sep. 17, 1991, abandoned.

[30] Foreign Application Priority Data

Sep. 17, 1990 [JP] Japan ................ 2-246592

[51] Int. Cl.$^6$ ............... H01L 29/78; H01L 33/00
[52] U.S. Cl. ...................... 257/186; 257/184
[58] Field of Search ........ 357/30, 4; 257/186, 257/184

[56] References Cited

U.S. PATENT DOCUMENTS

| | | | |
|---|---|---|---|
| 4,684,969 | 8/1987 | Taguchi | 357/30 |
| 4,795,225 | 1/1989 | Sakai | 350/96.13 |
| 4,833,101 | 5/1989 | Fujii | 437/107 |
| 4,982,255 | 1/1991 | Tomita | 357/30 |

FOREIGN PATENT DOCUMENTS

| | | |
|---|---|---|
| 61-167824 | 7/1986 | Japan ............. 357/30 |
| 2094573 | 4/1990 | Japan . |
| 2137376 | 5/1990 | Japan . |

OTHER PUBLICATIONS

K. F. Brennan, "Comparison of Multiquantum Well, Graded Barrier, and Doped Quantum Well GaInAs-/AlInAs . . . Approach", IEEE Journal of Quantum Electronics, vol. QE-23, No. 8, Aug. 1987, pp. 1273–1282.

T. Kagawa et al, "Impact Ionization Rates In An InGaAs/InAlAs Superlattice", Applied Physics Letters, vol. 55, No. 10, 4 Sep. 1989, pp. 993–995.

K. Mohammed et al, "New High-Speed Long-Wavelength Al0.48InO.52As/GaO.47InO.53As Multiquantum Well Photodiodes", Applied Physics Letters, vol. 47, No. 6, Sep. 1985, pp. 597–599.

*Primary Examiner*—Sara W. Crane
*Assistant Examiner*—Stephen D. Meier
*Attorney, Agent, or Firm*—Sughrue, Mion, Zinn, Macpeak & Seas

[57] ABSTRACT

An avalanche photodiode includes an avalanche multiplication layer including a superlattice structure consisting of a plurality of barrier and well layers both lattice matched to InP such that the plurality of barrier and well layers are alternately provided one layer on the other layer. The barrier layers consist of InAlAs and the well layers consist of InCaAlAs quarternary system mixed crystal having a forbidden width smaller than 1 eV.

1 Claim, 2 Drawing Sheets

LOW NOISE AVALANCHE PHOTODIODE HAVING AN AVALANCHE MULTIPLICATION LAYER OF INALAS/INGAALAS

This is a Continuation of application Ser. No. 07/761 078 filed Sep. 17, 1991 now abandoned.

FIELD OF THE INVENTION

This invention relates to a photodetector, and more particularly to an avalanche photodiode having a hetero-multi-layer structure used in an optical communication system.

BACKGROUND OF THE INVENTION

An avalanche photodiode is important as an optical detector in an optical communication system, because an avalanche photodiode is a semiconductor photodetector having high sensibility and high operation speed. There are several avalanche photodiodes which have been realized until now for an optical communication system using a silica optical fiber for transmitting a light having a wavelength of 1.3 μm or 1.55 μm, one of which is an avalanche photodiode using Ge or an avalanche photodiode having a hetero-junction structure of InP/InGaAs system including an optical absorption layer of InGaAs which is lattice matched to InP and an avalanche multiplication layer of InP.

These avalanche photodiodes are required to have a high S/N ratio for high quality optical communications. The S/N ratio depends on several factors, one of which is a noise factor. The noise factor depends on the ratio of ionization rates of electrons and holes of a material forming an avalanche region of an avalanche photodiode. The ratio of the ionization rates is required to be high for a high S/N ratio for avalanche photodiodes. However, the ratio of the ionization rates of an avalanche photodiode including an avalanche multiplication layer of Ge is approximately 1, and that of an avalanche photodiode including an avalanche multiplication layer of InP/InGaAs is up to 3. Therefore, materials having a high ratio of the ionization rates have been sought.

A first conventional avalanche photodiode having an avalanche layer consisting of InGaAs/InAlAs superlattice has been disclosed on page 467 of Electronics Letters, vol. 16, 1980 by Chin. R, et al and on page 597 of Applied Physics Letters, vol. 47, 1985 by Capasso. F, et al. In this avalanche photodiode, conduction band edge discontinuity energy (approximately 0.5 eV) between InGaAs and InAlAs is given to electrons which run through the avalanche multiplication layer from InAlAs to InGaAs at a high speed, so that the ionization rate of the electrons increases to increase the ratio of the ionization rates. The ratio of the ionization rates of an avalanche photodiode having an avalanche multiplication layer consisting of InGaAs/InAlAs was measured on page 993 of Applied Physics Letters, vol. 55, 1989 by Kagawa. T, et al, however, it has been found that the ionization rate of electrons increases dependence on the superlattice structure.

A second conventional avalanche photodiode includes an avalanche multiplication layer having InGaAsP/InAlAs superlattice structure disclosed in Japanese Preliminary Publication (Kokai) No. 2-137376 (corresponding to U.S. Pat. No. 4,982,255 to Tomita).

In this avalanche photodiode, well layers consist of InCaAsP quaternary system mixed crystal which has the forbidden bandgap energy of 1 to 1.2 eV due to its small discontinuity of the valence band.

According to the conventional avalanche photodiodes, however, there is a disadvantage in that noise characteristic is not sufficient. In the first conventional avalanche photodiode which includes an avalanche multiplication layer of InGaAs/InAlAs superlattice structure, the forbidden bandgap energy of InGaAs is approximately 0.75 eV, so that effective mass of electrons in InGaAs is as small as 0.04 times of that of free electrons. Therefore, a tunnel current flows on condition of a high electric field higher than 200 KV/cm, and a large dark current flows on condition of a high electric field higher than 300 KV/cm which is necessary for avalanche multiplication.

In the second conventional avalanche photodiode, it is difficult to fabricate an avalanche multiplication layer to provide a plurality of layers including P and layers not including P alternately one layer on the other layer with high reproducibility.

SUMMARY OF THE INVENTION

Accordingly, it is an object of the invention to provide an avalanche photodiode of low noise characteristic having a high ionization rate of electrons causing large electron initiated multiplication.

It is another object of the invention to provide an avalanche photodiode, having an avalanche multiplication layer which is easily fabricated.

According to a feature of the invention, an avalanche photodiode comprises:
 a substrate of InP;
 an avalanche multiplication layer;
 an optical absorption layer; and
 means for applying a predetermined voltage across the substrate, the avalanche multiplication layer and the optical absorption layer;
 wherein the avalanche multiplication layer includes a superlattice structure consisting of a plurality of barrier and well layers both lattice-matched to InP such that the plurality of barrier and well layers are alternately provided one layer on the other layer, and each of the barrier layers consists of InAlAs and each of the well layers consists of InGaAlAs quaternary system mixed crystal having a forbidden bandgap energy smaller than 1 eV.

BRIEF DESCRIPTION OF THE DRAWINGS

The invention will be explained in more detail in conjunction with appended drawings wherein.

DESCRIPTION OF THE PREFERRED EMBODIMENTS

Figure 1:
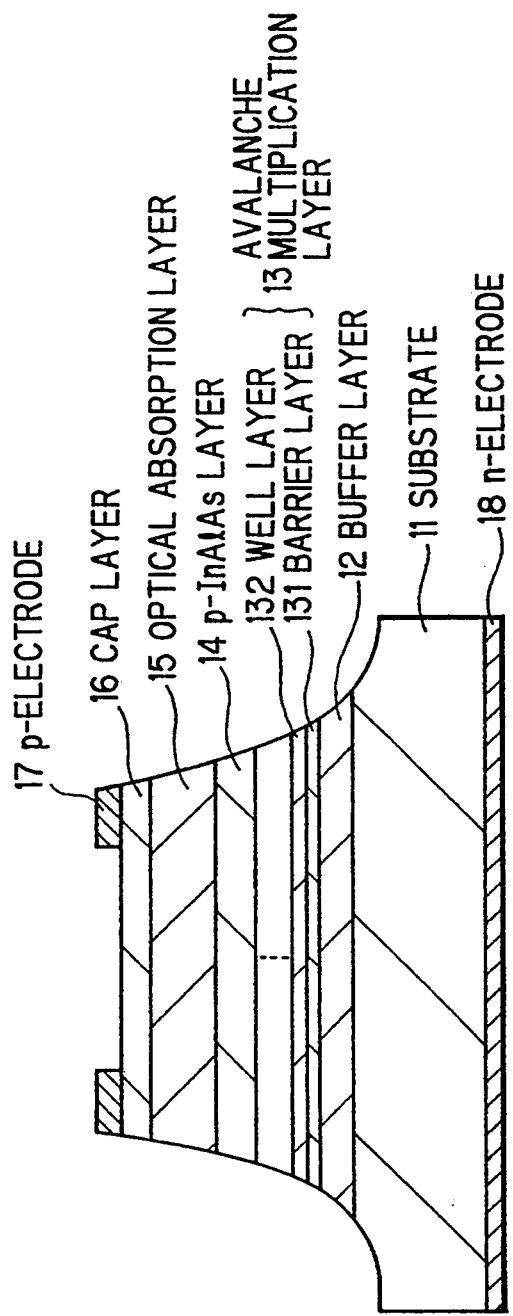
FIGS. 1 and 2 are cross-sectional views illustrating an avalanche photodiode in first and second preferred embodiments according to the invention.

FIG. 1 is a cross-sectional view illustrating an avalanche photodiode in a first preferred embodiment according to the invention. The avalanche photodiode includes a substrate 11 of n+-InP, a buffer layer 12 of n+-InP having a thickness of 1 μm and an impurity concentration of $1 \times 10^{18}$ cm$^{-3}$ formed on the substrate 11, an avalanche multiplication layer 13 (to be explained in detail later), a p-InAlAs layer 14 having a thickness of 0.25 μm and an impurity concentration of $1 \times 10^{17}$ cm$^{-3}$, an optical absorption layer 15 of p-InGaAs having a thickness of 2 μm, and a cap layer 16 of p+-InP having a thickness of 1 μm and an impurity concentration of $1 \times 10^{18}$ cm$^{-3}$. The avalanche multiplication layer 13 includes twenty barrier layers 131 of p-InAlAs having a thickness of 400 Å and an impurity concentration of $1 \times 10^{15}$ cm$^{-3}$ lattice-matched to InP and twenty well layers 132 of p-InAlGaAs quarternary system mixed crystal having a forbidden width of 0.95 eV, a thickness of 200 Å and an impurity concentration of $1 \times 10^{15}$ cm$^{-3}$ lattice-matched to InP, such that the respective twenty barrier and well layers 131 and 132 are alternately provided one layer on the other layer. The avalanche photodiode further includes a ring-shaped p-electrode 17 provided on a top surface of the cap layer 16, and an n-electrode 18 provided on a second surface of the substrate 11.

In fabrication, the buffer layer 12, the alternate barrier and well layers 131 and 132, the p-InAlAs layer 14, the optical absorption layer 15, and the cap layer 16 are successively grown on the substrate 11 by use of, for example, the metalorganic vapor phase epitaxy (MOVPE).

In the avalanche photodiode, discontinuity energy of the conduction band is used to increase the ionization rate of electrons, so that the ratio of ionization rate of electrons to that of holes becomes over 10. Further, the barrier layers consist of InAlAs and the well layers consist of InAlGaAs having a forbidden bandgap energy below 1.0 eV, so that dark current is below 1 µA on a bias condition where the gain is over 10. Consequently, the avalanche photodiode has excellent performance, such as high quality and low noise characteristics in optical communications. On the other hand, the discontinuity of the valence band in the superlattice region of the avalanche multiplication layer is eased against holes of electron-hole pairs generated in the process of avalanche multiplication, so that the avalanche photodiode has a high speed response.

Figure 2:
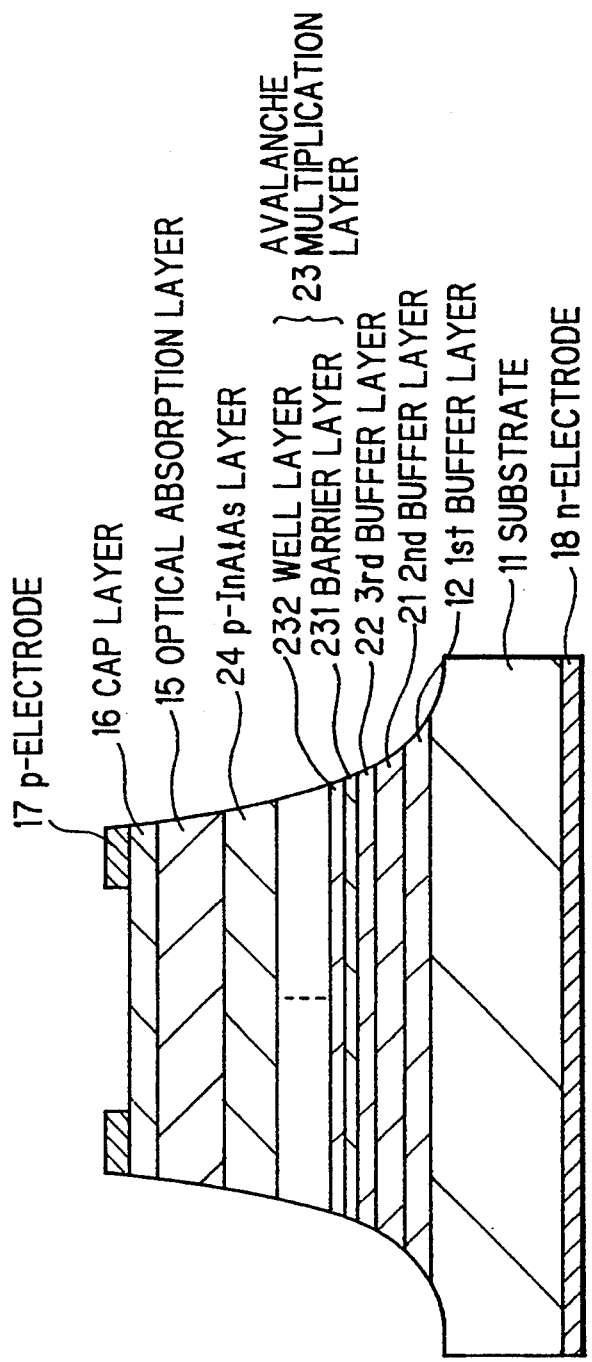

FIG. 2 is a cross-sectional view illustrating an avalanche photodiode in a second preferred embodiment according to the invention. The avalanche photodiode includes a substrate 11 of n+-InP, a first buffer layer 12 of n+-InP, a second buffer layer 21 of n+-InGaAs, a third buffer layer 22 of n+-InAlAs, an avalanche multiplication layer 23, a p-InAlAs layer 24 having a thickness of 0.25 µm and an impurity concentration of $1 \times 10^{17}$ cm$^{-3}$, an optical absorption layer 15 of p-InGaAs having a thickness of 2 µm, and a cap layer 16 of p+-InP having a thickness of 1 µm and an impurity concentration of $1 \times 10^{13}$ cm$^{-3}$. The avalanche multiplication layer 23 includes twenty barrier layers 231 of p-InAlAs having a thickness of 400 Å and an impurity concentration of $1 \times 10^{15}$ cm$^{-3}$ and twenty well layers 232 of p-InAlGaAs quarternary system mixed crystal having a forbidden bandgap energy of 0.9 eV, a thickness of 400 Å and an impurity concentration of $1 \times 10^{15}$ cm$^{-3}$ lattice-matched to InP, such that the respective twenty barrier and well layers 231 and 232 are alternately provided one layer on the other layer. The avalanche photodiode further includes a p-electrode 17 having a light aperture provided on a top surface of the cap layer 16, and an n-electrode 18 provided on a second surface of the substrate 11.

In this avalanche photodiode, the same performances can be realized as in the avalanche photodiode in the first preferred embodiment. In addition, the avalanche multiplication layer 23 is much improved in quality as compared to that of the first preferred embodiment, because the first to third buffer layers 12, 21 and 22 are provided on the substrate 11 to enhance the surface property of the substrate 11.

Although the invention has been described with respect to specific embodiment for complete and clear disclosure, the appended claims are not to be thus limited. Alternative constructions that may occur to one skilled in the art which fairly fall within the basic teaching herein set forth are intended to be covered.

What is claimed is:

1. An avalanche photodiode, comprising,
  a substrate of InP;
  an avalanche multiplication layer;
  an optical absorption layer; and
  means for applying a predetermined voltage across said substrate, said avalanche multiplication layer and said optical absorption layer;
  wherein said avalanche multiplication layer includes a superlattice structure consisting of a plurality of barrier and well layers, each of said plurality of barrier and well layers lattice-matched to InP such that said plurality of barrier and well layers are alternately provided one layer on the other layer, and each of said barrier layers consists of InAlAs and each of said well layers consists of InGaAlAs quaternary system mixed crystal having a forbidden bandgap energy smaller than 1 eV, wherein a conduction band discontinuity energy of said superlattice structure is utilized for ionization of electrons and each of said InGaAlAs well layers is utilized for reduction of dark current; and
  wherein Phosphorous is not present in the avalanche multiplication layer.

* * * * *

UNITED STATES PATENT AND TRADEMARK OFFICE
CERTIFICATE OF CORRECTION

PATENT NO. : 5,432,361
DATED : July 11, 1995
INVENTOR(S) : Kenko Taguchi

It is certified that error appears in the above-indentified patent and that said Letters Patent is hereby corrected as shown below:

Col. 3, line 48, delete "$10^{13}$" insert -- $10^{18}$ --

Signed and Sealed this

Tenth Day of October, 1995

Attest:

BRUCE LEHMAN

Attesting Officer

Commissioner of Patents and Trademarks